United States Patent
Kono et al.

(10) Patent No.: US 8,941,335 B2
(45) Date of Patent: Jan. 27, 2015

(54) SEMICONDUCTOR LIGHT-EMITTING ELEMENT AND FLASH-LIGHT DEVICE

(75) Inventors: Keima Kono, Tokyo (JP); Eiji Takashiro, Tokyo (JP); Tatsuma Saito, Tokyo (JP); Tsutomu Okubo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 293 days.

(21) Appl. No.: 13/483,416

(22) Filed: May 30, 2012

(65) Prior Publication Data

US 2012/0306410 A1 Dec. 6, 2012

(30) Foreign Application Priority Data

Jun. 1, 2011 (JP) .................................. 2011-123270

(51) Int. Cl.
*H05B 37/02* (2006.01)
*H01L 33/38* (2010.01)

(52) U.S. Cl.
CPC ........ *H01L 33/38* (2013.01); *G03B 2215/0567* (2013.01)
USPC .......................... 315/362; 315/200 A; 315/294

(58) Field of Classification Search
USPC ............... 257/79–82, 84, 85, 88, 98, 99, 103; 315/200 A, 291, 294, 362
See application file for complete search history.

(56) References Cited

U.S. PATENT DOCUMENTS

| | | | |
|---|---|---|---|
| 6,444,998 B1 | 9/2002 | Taniguchi et al. | |
| 6,885,035 B2* | 4/2005 | Bhat et al. | 257/99 |
| 7,652,274 B2 | 1/2010 | Wernersson | |
| 8,378,373 B2* | 2/2013 | Wang et al. | 257/99 |
| 2002/0005523 A1 | 1/2002 | Taniguchi et al. | |
| 2006/0192223 A1 | 8/2006 | Lee et al. | |
| 2009/0072257 A1* | 3/2009 | Unno et al. | 257/98 |
| 2010/0078671 A1 | 4/2010 | Huang et al. | |
| 2010/0207146 A1* | 8/2010 | Iizuka et al. | 257/98 |

(Continued)

FOREIGN PATENT DOCUMENTS

| | | |
|---|---|---|
| EP | 1 689 148 A1 | 8/2006 |
| JP | 2005-338280 A | 12/2005 |
| JP | 2008-028269 A | 2/2008 |

(Continued)

OTHER PUBLICATIONS

Extended European Search Report (EESR) dated Oct. 1, 2012 (in English) issued in counterpart European Application No. 12004199.1.

*Primary Examiner* — Tung X Le
(74) *Attorney, Agent, or Firm* — Holtz, Holtz, Goodman & Chick PC

(57) ABSTRACT

There is provided a light-emitting element which includes a first semiconductor layer, a second semiconductor layer having an electrical conductivity that is different from that of the first semiconductor layer and an active layer disposed between the first and second layers, and a first and second electrodes respectively disposed on surfaces of the first and second semiconductor layers. The first electrode comprises a plurality of electrode pieces separated from each other; and each of the electrode pieces comprises a power feed pad, and an extended portion connected to the pad and that extends in a direction away from the pad, and a terminal end portion of the extended portion of an electrode piece is opposed to a terminal end portion of the extended portion of the other electrode piece across a gap.

15 Claims, 10 Drawing Sheets

(56) References Cited

U.S. PATENT DOCUMENTS

2010/0258824 A1 10/2010 Wang et al.
2010/0258836 A1 10/2010 Wang et al.

FOREIGN PATENT DOCUMENTS

| | | |
|---|---|---|
| JP | 2008-102199 A | 5/2008 |
| JP | 2008-529095 A | 7/2008 |

* cited by examiner

FIG.3A
| LIGHT DISTRIBUTION PATTERN | APPLIED ELECTRIC CURRENT AMOUNT | |
|---|---|---|
| | FIRST LIGHT-EMITTING PORTION | SECOND LIGHT-EMITTING PORTION |
| 1 | ○ | ○ |
| 2 | ○ | △ |
| 3 | △ | ○ |
FIG.3B
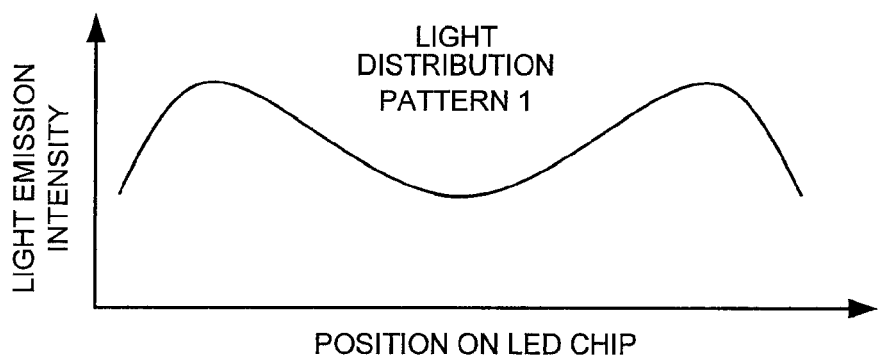
FIG.3C
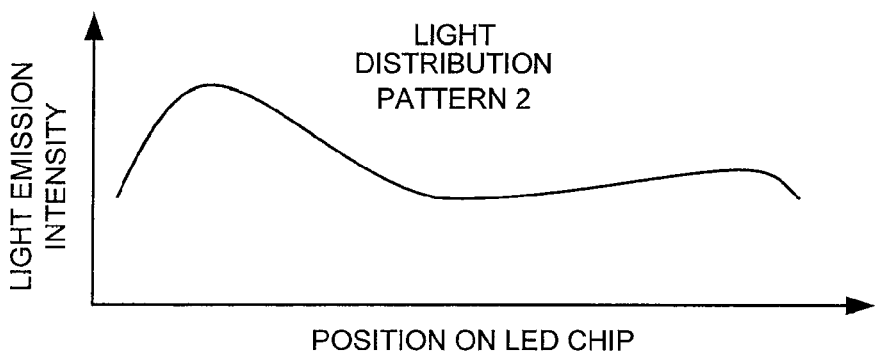
FIG.3D
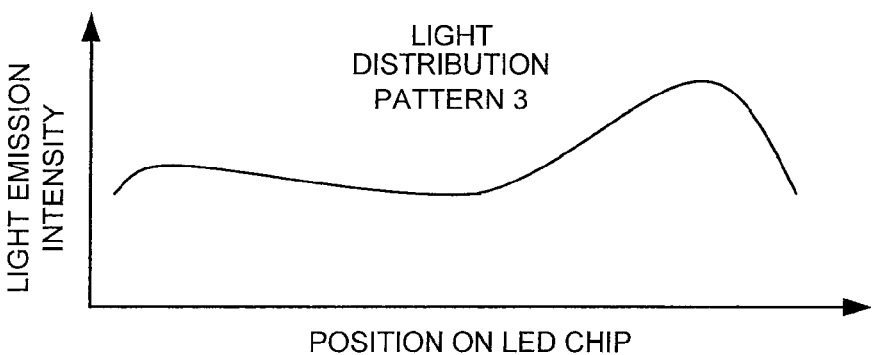

LIGHT DISTRIBUTION PATTERN-1

LIGHT DISTRIBUTION PATTERN-2

LIGHT DISTRIBUTION PATTERN-3

FIG.6A
| LIGHT DISTRIBUTION PATTERN | APPLIED ELECTRIC CURRENT AMOUNT | | |
|---|---|---|---|
| | FIRST LIGHT-EMITTING PORTION | AUXILIARY LIGHT-EMITTING PORTION | SECOND LIGHT-EMITTING PORTION |
| 1 | ○ | △ | ○ |
| 2 | ○ | △ | △ |
| 3 | △ | △ | ○ |
| 4 | ○ | ○ | ○ |
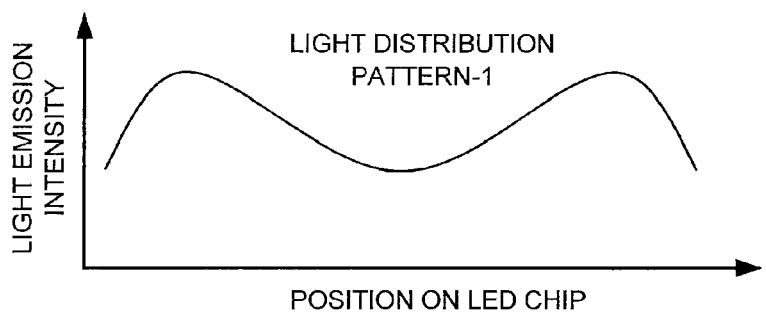
FIG.6B
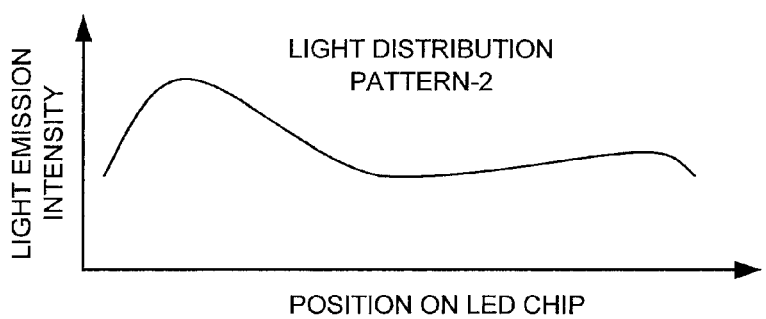
FIG.6C
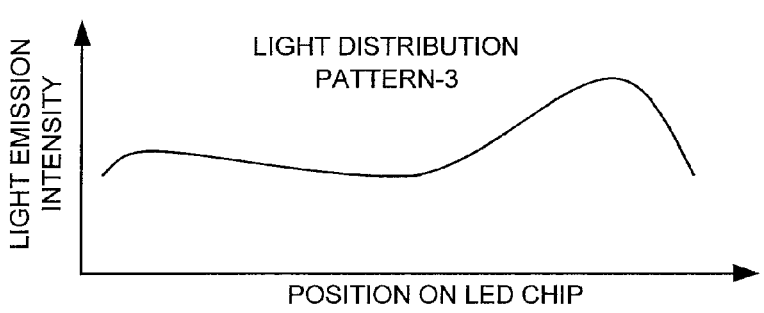
FIG.6D
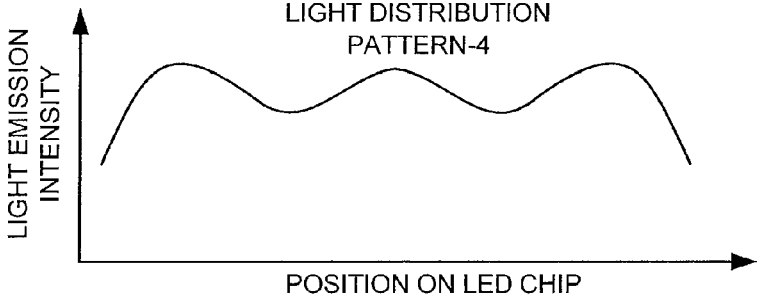
FIG.6E

FIG.9A

| IMAGE PICKUP AREA | APPLIED ELECTRIC CURRENT AMOUNT | | |
|---|---|---|---|
| | FIRST, SECOND LIGHT-EMITTING PORTIONS | THIRD, FOURTH LIGHT-EMITTING PORTIONS | FIFTH, SIXTH LIGHT-EMITTING PORTIONS |
| LARGE | ○ | ○ | ○ |
| SMALL | △ | ○ | △ |

FIG.9B

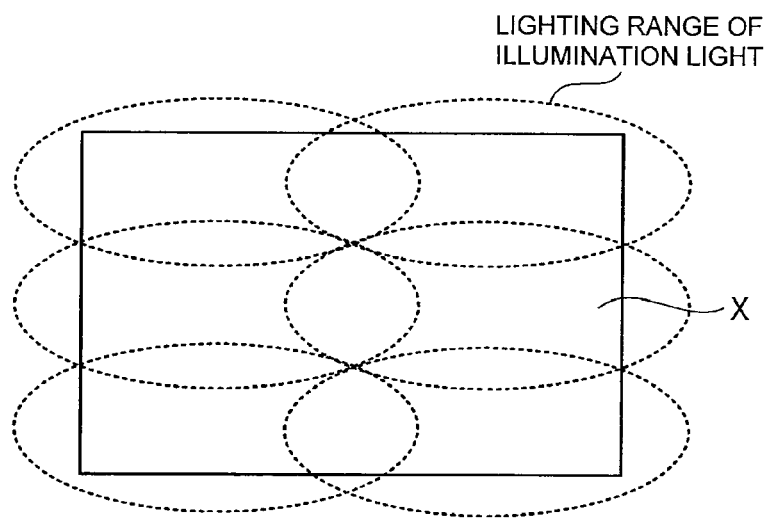

FIG.9C

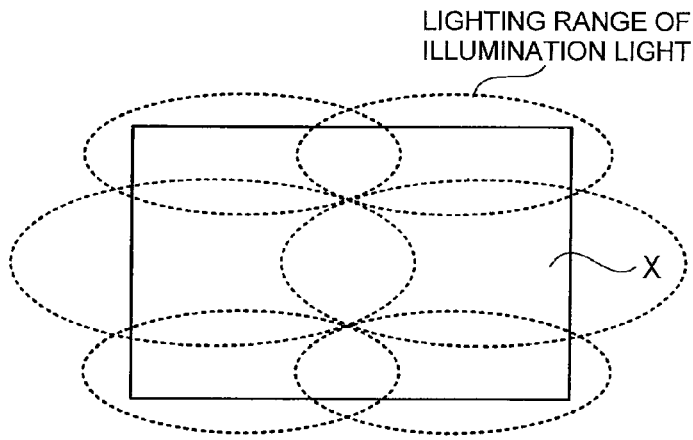

FIG.10

| LIGHT-EMITTING MODE | APPLIED ELECTRIC CURRENT AMOUNT | | |
|---|---|---|---|
| | FIRST, SECOND LIGHT-EMITTING PORTIONS | THIRD, FOURTH LIGHT-EMITTING PORTIONS | FIFTH, SIXTH LIGHT-EMITTING PORTIONS |
| FLASH LIGHT-EMITTING MODE | ○ | ○ | ○ |
| CONTINUOUS LIGHT-EMITTING MODE | × | △ | × |

FIG.12A
| LIGHT-EMITTING MODE | APPLIED ELECTRIC CURRENT AMOUNT | |
|---|---|---|
| | PRELIMINARY LIGHT-EMITTING PORTION | FLASH LIGHT-EMITTING PORTION |
| PRELIMINARY LIGHT-EMITTING MODE | ○ | × |
| FLASH LIGHT-EMITTING MODE | × | ○ |
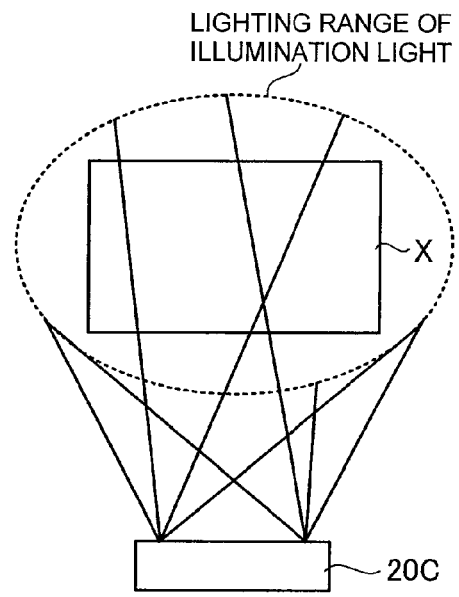
FIG.12B
<PRELIMINARY LIGHT-EMITTING MODE>
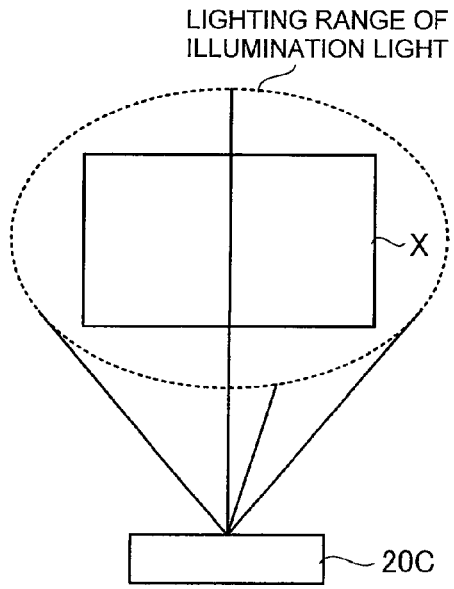
FIG.12C
<FLASH LIGHT-EMITTING MODE>

SEMICONDUCTOR LIGHT-EMITTING ELEMENT AND FLASH-LIGHT DEVICE

BACKGROUND OF THE INVENTION

1. Technical Field

The present invention relates to a semiconductor light-emitting element and a flash light device having the semiconductor light-emitting element.

2. Description of the Related Art

There is known an image pickup device provided with a strobe or flash light device that uses a light-emitting diode (LED) as a light source. Also known is an image pickup device having a variable light-distribution mechanism for suitably directing illumination light on an object in an image pickup area (or angle of view) in a flash light device.

For example, Japanese Laid-open Patent Publication No. 2005-338280 (hereinafter referred to as Patent Document 1) describes constituting a light source using a plurality of light-emitting diodes, and varying the number of light-emitting diodes that are lit or illuminate in accordance with focal distance information of an image pickup lens to thereby obtain a required lighting angle of illumination light.

Also, Japanese Laid-open Patent Publication No. 2008-102199 (hereinafter referred to as Patent Document 2) describes an illumination or lighting device in which a light-emitting region of a single light-emitting element is divided by dividing a cathode electrode, and any of the light-emitting regions is caused to emit light in accordance with the angle of view of the image pickup device.

Also, Japanese Domestic Republication No. 2008-529095 (hereinafter referred to as Patent Document 3) describes an illumination device used together with a camera, wherein the light-emitting element includes two or more light-emitting zones, and the light-emitting zones are individually and selectively controlled and emit intensity-controlled light.

Also, Japanese Laid-open Patent Publication No. 2008-28269 (hereinafter referred to as Patent Document 4) describes an illumination device configured by forming a plurality of dispersed electrodes on the surface of a light-emitting element, and connecting a drive circuit to each of the dispersed electrodes.

SUMMARY OF THE INVENTION

When the light source is composed of a plurality of light-emitting elements in the same manner as the illumination device described in Patent Document 1, light distribution control is facilitated because the light emission points are completely separated from each other. However, there are cases in which position offsets are readily generated in the mounting positions of the light-emitting elements and the formation of light distribution is compromised. Also, there is a problem in that it is difficult to reduce the size of the device and the number of components is increased because the surface area of the mounting substrate on which the light-emitting elements are arranged is increased. In terms of solving the problems described above, it is effective to use a configuration so that the light-emitting region of the light-emitting elements is divided and so that the light-emitting regions can be individually controlled, as described in Patent Documents 2 to 4.

The ability to form a desired light emission intensity distribution in an image pickup area (or angle of view) is important in terms of realizing variable light-distribution in a flash light device. For example, when an object is positioned leftward from the center in the image pickup area, it is necessary to form light distribution so that the left side in the image pickup area becomes brighter. It is not easy to form such a light distribution by merely individually controlling the light-emitting region divided in terms of the light-emitting elements. It is preferred that a plurality of light-emitting regions be configured so as to be regarded as a plurality of light sources in order to carry out such light distribution control. In other words, it is preferred that the light-emitting elements be configured so that the light radiated simultaneously from a plurality of light-emitting regions is perceived to be a plurality of light emission points.

The present invention was contrived in view of the foregoing matters, it being an object thereof to provide a flash light device capable of forming a desired light distribution in an image pickup area, and a semiconductor light-emitting element used in the flash light device.

According to the present invention, there is provided a semiconductor light-emitting element comprising a first semiconductor layer having a first electrical conductivity, a second semiconductor layer having a second electrical conductivity that is different from the first electrical conductivity, an active layer disposed between the first semiconductor layer and the second semiconductor layer, and a first electrode and a second electrode respectively disposed on surfaces of the first and second semiconductor layers, wherein the first electrode comprises a plurality of electrode pieces separated at a distance from each other; and each of the plurality of electrode pieces comprises a power feed pad, and an extended portion that is connected to the power feed pad and that extends in a direction away from the power feed pad, and a terminal end portion of the extended portion of an electrode piece is opposed to a terminal end portion of the extended portion of the other electrode piece across a gap.

The flash light device according to the present invention is a flash light device having the semiconductor light-emitting element described above, the flash light device comprising a controller for feeding a drive current to the semiconductor light-emitting element via each of the plurality of electrode pieces.

In accordance with the semiconductor light-emitting element and the flash light device having the semiconductor light-emitting element according to the present invention, the extension portions constituting the first and second electrode pieces extend in a direction away from the power feed pads, which are points for applying electric current, and have a resistance component that increases along the extension direction of the extension portions. Consequently, the electric current density in the terminal end portions of the extension portions is relatively low. Since the terminal end portions of the extension portions face (i.e., are opposed to) each other across a gap, a portion having a relatively low electric current density, i.e., a portion having relatively low light emission intensity is formed in the gap portion in the semiconductor film. A plurality of light-emitting portions formed on the semiconductor light-emitting element is arranged so that the portion in which the light emission intensity is relatively lower is disposed between the light-emitting portions. The light radiated simultaneously from the plurality of light-emitting portions can thereby be perceived as a plurality of light emission points. In other words, the plurality of light-emitting portions are regarded to be a plurality of independent light sources, and it is therefore possible to readily form a desired light-distribution.

BRIEF DESCRIPTION OF THE DRAWINGS

FIG. 3A is a chart showing modes of drive current control for the light-emitting portions that correspond to each light-distribution pattern, and FIGS. 3B to 3D are graphs showing light emission intensity distributions on an LED chip that correspond to each light-distribution pattern;

FIG. 6A is a chart showing modes of drive current control for the light-emitting portions that correspond to each light-distribution pattern, and FIGS. 6B to 6E are graphs showing light emission intensity distributions on an LED chip that correspond to each light-distribution pattern;

FIG. 9A is a chart showing modes of electric current control for each light-emitting portion in accordance with the range of the image pickup area, and FIGS. 9B and 9C are diagrams showing lighting range of the illumination light that corresponds to the electric current control shown in FIG. 9A;

FIG. 10 is a chart showing modes of electric current control for each light-emitting portion in the flash light-emitting mode and the continuous light-emitting mode;

FIG. 12A is a chart showing modes of electric current control for each light-emitting portion in the preliminary light-emitting mode and the flash light-emitting mode, and FIGS. 12B and 12C are diagrams showing the lighting range of the illumination light during preliminary light emission and flash light emission, respectively.

DETAILED DESCRIPTION OF THE INVENTION

Figure 1:
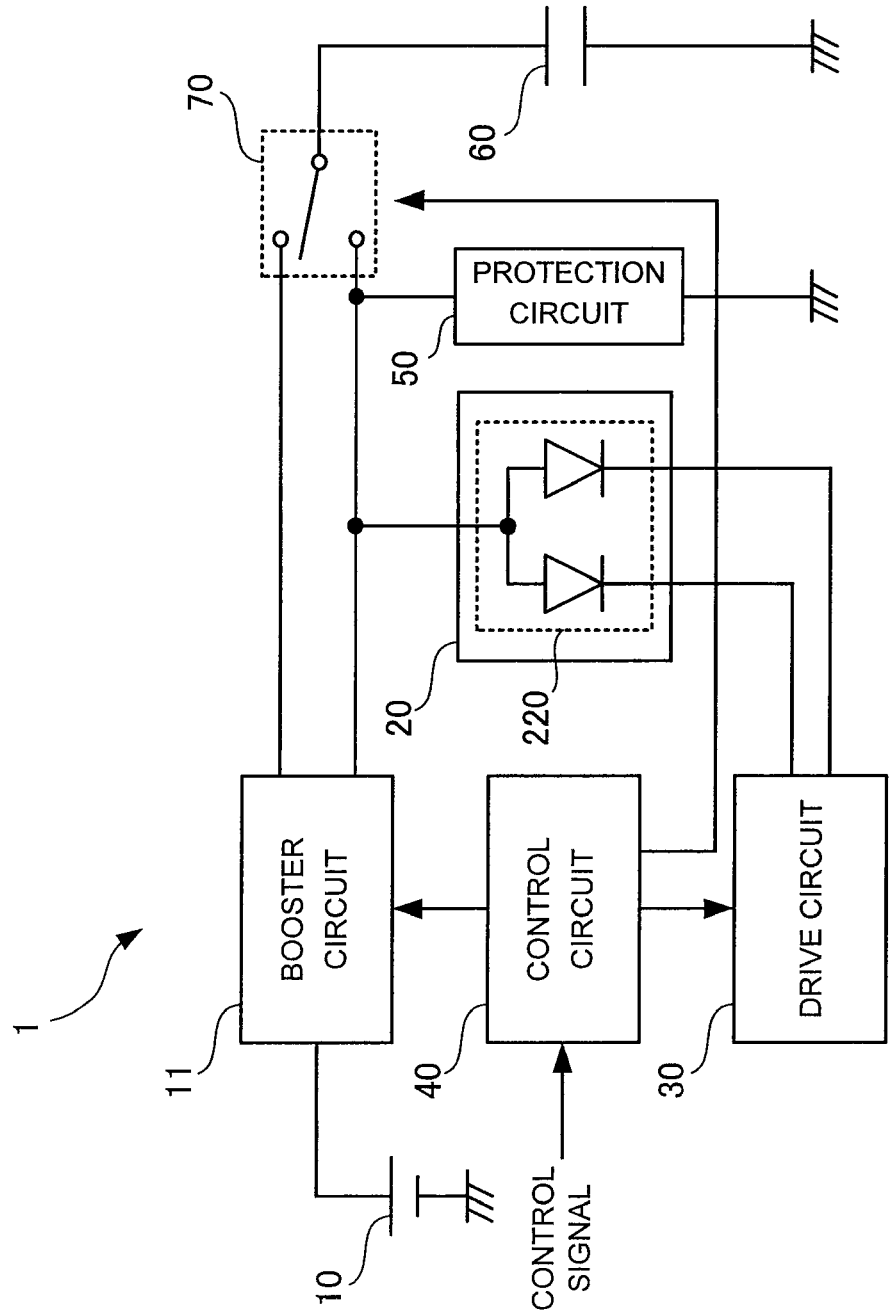
FIG. 1 is a functional block view showing the configuration of the flash light device 1 according to a first embodiment of the invention.

The flash light device according to embodiments of the present invention is described below with reference to the attached drawings. In the drawings, the same reference numerals are used for the same or essentially the same or equivalent constituent elements and portions.

First Embodiment

FIG. 1 is a functional block view showing the configuration of the flash light device 1 according to a first embodiment of the invention. The flash light device 1 is provided as an accessory to, e.g., a digital camera or other image pickup device, and is a device for directing illumination light toward an image pickup area during photography or at other times.

A power source 10 is a DC power source for generating illumination light in a light source portion 20. The power source 10 may double as a power source of the image pickup device to which the flash light device 1 is accessory. A booster circuit 11 boosts the DC voltage generated by the power source 10 to a voltage required for generating illumination light in the light source portion 20. In other words, the booster circuit 11 generates voltage that is greater than a forward voltage VF of light-emitting diodes constituting the light source portion 20. The booster circuit 11 is composed of, e.g., a charge pump-type or chopper-type DC-DC converter. The DC voltage boosted by the booster circuit 11 is fed to an anode electrode of a light-emitting diode (LED) chip 220 constituting the light source portion 20.

The light source portion 20 generates illumination light using the electric power fed from the power source 10 as drive power, and directs the illumination light toward the image pickup area. The light source portion 20 includes a single LED chip 220. The LED chip 220 has a plurality of light-emitting portions that can be mutually isolated and independently controlled. In the present embodiment, the case in which the LED chip 220 has two light-emitting portions is used as an example. Each of the mutually isolated light-emitting portions is connected to a drive circuit 30. The configuration of the light source portion 20 is later described in greater detail.

The drive circuit 30 independently controls the drive current of the plurality of light-emitting portions formed in the LED chip 220, on the basis of control signals from the controller 40. The drive circuit 30 has, e.g., a variable current circuit connected to each of the cathode electrodes of the LED chip 220. Each of the plurality of light-emitting portions emits light at a light emission intensity that corresponds to the magnitude of the independently controlled drive current. In other words, the plurality of light-emitting portions can emit light at light emission intensities different from each other.

A controller 40 controls the light emission of the LED chip 220 on the basis of, e.g., control signals from a host device that controls the operation of the image pickup device overall, or on the basis of operational input from a user. In other words, the controller 40 turns light-emitting portions of the LED chip 220 on and off, sets the light-emission intensity or the like, and feeds control signals to the booster circuit 11 and the drive circuit 30, on the basis of commands from the exterior. The booster circuit 11 boosts the voltage in accordance with the control signal fed from the controller 40, and stops boosting voltage at a set voltage value. The drive circuit 30 controls the amount of electric current applied to the light-emitting portions of the LED chip 220 on the basis of a control signal (e.g., electric current command value) fed from the controller 40.

A protection circuit 50 is provided with the aim of protecting the LED chip 220, and may include, e.g., a Zener diode, a varistor, a capacitor or other element for absorbing a surge voltage applied to the LED chip 220, a thermal conduction chip (e.g., Japanese Laid-open Patent Application No. 2010-267834) or other element for radiating heat from the LED chip 220, and a thermistor or other heat detection element for detecting the junction temperature of the LED chip 220.

A capacitor 60 constitutes charge-accumulating means provided as required in the case that a flash of light (i.e., photoflash) is generated in the light source portion 20. The flash of light requires a greater drive current, and accordingly there are cases in which the operation of other devices (e.g., the image pickup device) that share the power source 10 will become unstable when the drive current directly feeds from the power source 10. In view of this situation, a charge is temporarily accumulated in the capacitor 60 when a flash of light is to be generated, and a drive current is fed from the capacitor 60 to the light-emitting portions inside the LED chip. A switch 70 switches the connection destination of the capacitor 60 to the booster circuit 11 or any of the anode lines in accordance with a control signal from the controller 40 to thereby charge and discharge the capacitor 60. The voltage stop function of the booster circuit may be included in the drive circuit, and the switch 70 is not required in this case.

Figure 2A:
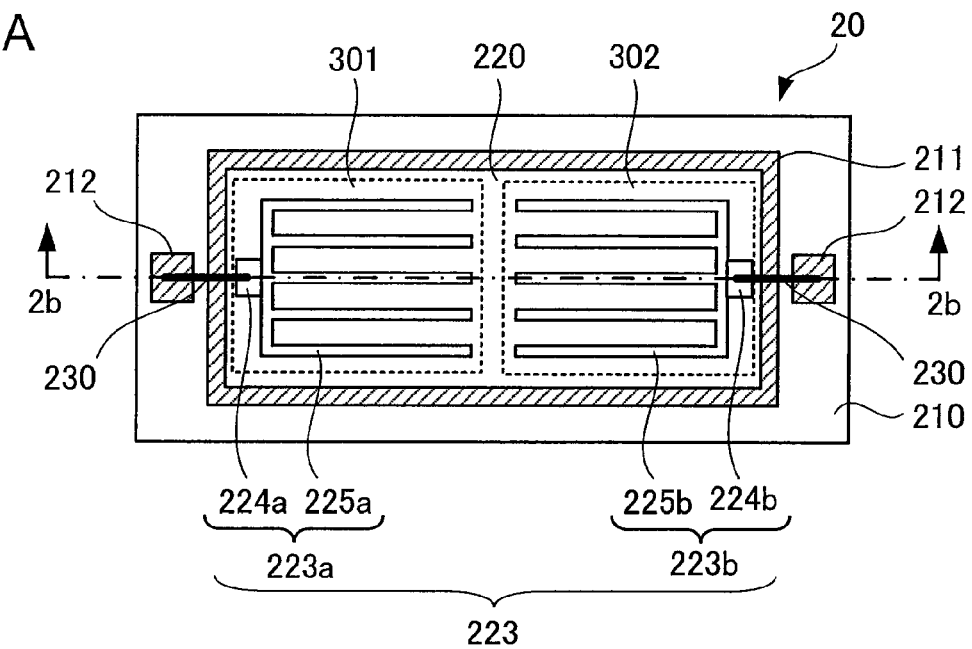
FIG. 2A is a plan view showing a detailed configuration of the light source portion according to the first embodiment of the invention.
Figure 2B:
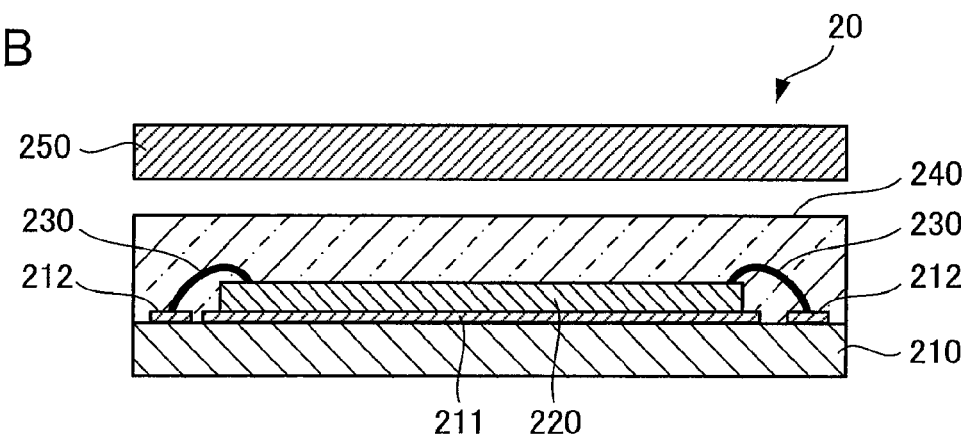
FIG. 2B is a cross-sectional view along the line 2b-2b in FIG. 2A.
Figure 2C:
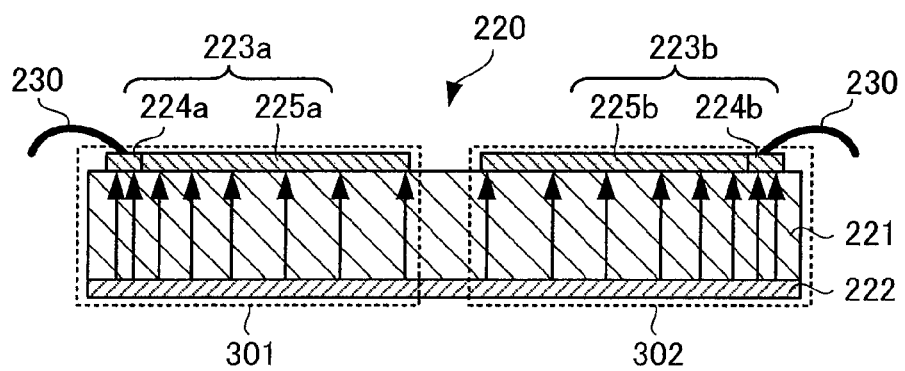
FIG. 2C is a cross-sectional view showing the state of drive current that flows inside the LED chip according to the embodiment of the invention.

FIG. 2A is a plan view showing the configuration of the light source portion 20 in greater detail. FIG. 2B is a cross-sectional view along the line 2b-2b in FIG. 2A, and FIG. 2C is a cross-sectional view showing the state of drive current that flows inside the LED chip 220.

A substrate 210 is constructed from a board material composed of, e.g., ceramic, glass epoxy resin, or another insulator. The substrate 210 has a die pad 211 composed of an electroconductor on the chip mounting surface on which the LED chip 220 is mounted, and two bonding pads 212 that correspond to a first light-emitting portion 301 and a second light-emitting portion 302 formed on the LED chip 220. The die pad 211 is connected to the booster circuit 11, and the bonding pads 212 are connected to the drive circuit 30. A single LED chip 220 is mounted on the die pad 211. An anode electrode 222 disposed on the mounting surface side of the LED chip 220 is joined to the die pad 211 via an electroconductive die attachment material (not shown). The cathode electrode 223 disposed on the light extraction plane side of the LED chip 220 is connected to the bonding pads 212 via bonding wires 230. A solder connection using reflow or another suitable method may be used in place of the connection via the bonding wires 230 as long as the electrical connection relationship is the same.

The LED chip 220 has: a semiconductor film 221 formed by layering an n-type semiconductor layer, an active layer, and a p-type semiconductor layer composed of, e.g., GaN-based semiconductors; an anode electrode (p-electrode) 222 provided so as to cover substantially the entire surface of the p-type semiconductor layer disposed on the mounting surface side of the semiconductor film 221; and a cathode electrode (i.e., n-electrode) 223 provided to the surface of the n-type semiconductor layer arranged on the light extraction plane side of the semiconductor film 221. The anode electrode and the cathode electrode are in, e.g., a "vertical" configuration arranged on the obverse and reverse surfaces, respectively, of the semiconductor film, but the anode electrode and the cathode electrode may also be in a "lateral" configuration arranged on the same surface of the semiconductor film.

The cathode electrode 223 is composed of a first electrode piece 223a and a second electrode piece 223b that are set at a distance from each other on the surface of the n-type semiconductor layer. In this manner, the first light-emitting portion 301 and the second light-emitting portion 302 separated at a distance from each other can be formed inside the LED chip 220. The first and second electrode pieces 223a, 223b include pad portions 224a, 224b, respectively, and extension portions 225a, 225b, respectively.

Each of the pad portions 224a, 224b is disposed in the peripheral portion of the LED chip 220. The pad portions 224a, 224b are connected to the bonding pads 212, respectively, on the substrate 210 via the bonding wires 230. The extension portions 225a, 225b are connected to the pad portions 224a, 224b, respectively, and extend from the peripheral portion of the LED chip 220 toward the center portion (i.e., away from the pad portions 224a, 224b). The extension portions 225a, 225b may have a pectinate or comb pattern as shown in FIG. 2A. The extension portions 225a, 225b terminate just short of the center line of the chip surface and do not mutually intersect or couple together. In other words, the terminal end portion of the extension portion 225a of the first electrode piece and the terminal end portion of the extension portion 225b of the second electrode piece face (i.e., are opposed to) each other across a gap in the center portion of the chip. The extension portions 225a, 225b are preferably set at a sufficient distance from each other so that electric currents spreading from the terminal end portions thereof do not merge together. The first and second electrode pieces 223a, 223b are arranged side by side along the extended direction of the extension portions 225a, 225b. The cathode electrode 223 composed of the first and second electrode pieces 223a, 223b is formed in a point-symmetric pattern about the center point of the light extraction plane (i.e., the obverse surface of the n-type semiconductor layer) of the LED chip 220.

The first and second electrode pieces 223a, 223b are connected to the drive circuit 30 via the bonding wires 230, which are connected to the pad portions 224a, 224b, respectively, and independently controlled drive current is fed to the first and second light-emitting portions 301, 302.

When drive current is applied to each of the light-emitting portions, the electric current density directly below the pad portions 224a, 224b, which are electric current application points, is increased in a relative manner, as shown in FIG. 2C. The extension portions 225a, 225b have a resistance component that increases along the direction of extension, and the electric current density directly below the terminal end of the extension portions 225a, 225b is therefore reduced in a relative manner. The terminal end portions of the extension portions 225a, 225b are concentrated in the center portion of the chip surface and a region of low electric current density is therefore formed in the center portion of the chip. In other words, the light emission intensity in the light extraction plane of the LED chip become relatively high at the peripheral portions or end portions of the chip in which the pad portions 224a, 224b are disposed, and gradually decreases in progression to the center portion of the chip (see FIG. 3B). In this manner, in accordance with the configuration of the cathode electrode 223 according to the present embodiment, the light simultaneously radiated from two light-emitting portions can be perceived as two light emission points because a portion having relatively low light emission intensity is formed between the first light-emitting portion 301 and the second light-emitting portion 302. The extension portions 225a, 225b have a pectinate or comb pattern, whereby the electric current density distribution in the direction orthogonal to the direction of extension of the extension portions 225a, 225b (i.e., the direction in which the lines are arrayed) becomes uniform and the light emission intensity distribution in the stated direction becomes uniform.

A fluorescent-substance containing resin 240 is disposed on the substrate 210 so as to embed the LED chip 220. The fluorescent-substance containing resin 240 is composed of a resin material in which a YAG:Ce fluorescent substance is dispersed in silicone resin or another light-transmissive resin. The YAG:Ce fluorescent substance absorbs blue light having peak wavelength of, e.g., 460 nm that is radiated from the LED chip 220, and converts the absorbed blue light into yellow light having a light emission peak at a wavelength of, e.g., about 560 nm. White light is obtained from the light source portion 20 by a mixture of the yellow light having a wavelength converted by the fluorescent substance and the blue light transmitted through the fluorescent-substance containing resin 240 without undergoing wavelength conversion. When white light is desired, apart from using a YAG:Ce fluorescent substance, it is also possible to use a fluorescent substance that absorbs blue light emitted from the LED chip 220 to emit a yellow fluorescent light, or to use a known mixture in a suitable ratio of fluorescent substances that emit red color and/or green color. In the case that a light of a color other than white is desired, it is possible to include in the resin for embedding the LED chip 220 a fluorescent substance that emits a fluorescent light which does not have a complementary relationship with the light emitted from the LED chip 220, to use a transparent resin that does not contain a fluorescent substance, or to eschew the use of a resin itself.

When the fluorescent substance-containing resin 240 is used, the thickness is more preferably low so that the formation of light distribution is not compromised in the later-described image pickup area. The thickness is preferably 300 μm or less.

A lens 250 is disposed above (i.e., forward in the light projection direction) the fluorescent-substance-containing resin 240. The lens 250 is composed of acrylic, carbonate, silicone, epoxy, urethane, liquid crystal polymer, or another light-transmissive resin having a higher refractive index than air. The lens 250 projects light from the LED chip 220 onto a lighting surface so that the lighting range of the illumination light covers the entire image pickup area. The lens 250 has a single focal point or focus for the plurality of light-emitting portions formed in the LED chip 220, and the light emission intensity distribution that appears on the light extraction plane of the LED chip 220 is reproduced on the light radiation surface. The lens surface for controlling light-distribution may be disposed on the LED chip side or the light radiation surface side.

Figure 4A:
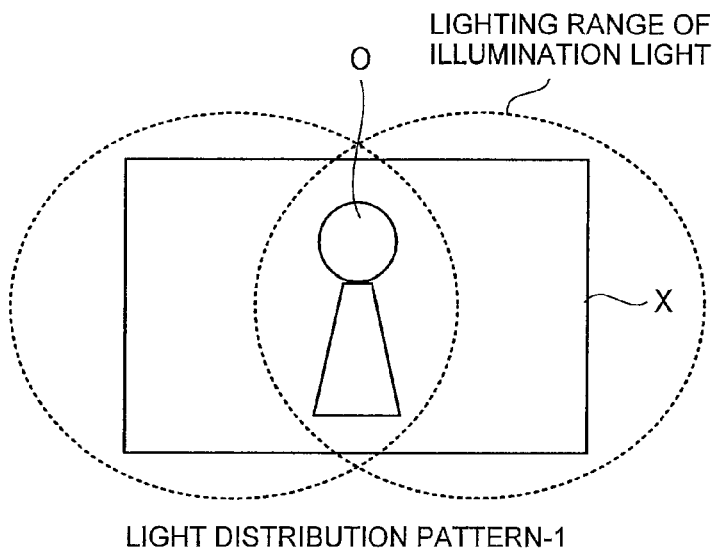
FIGS. 4A to 4C are diagrams showing the lighting ranges of the illumination light that correspond to each light-distribution pattern.
Figure 4B:
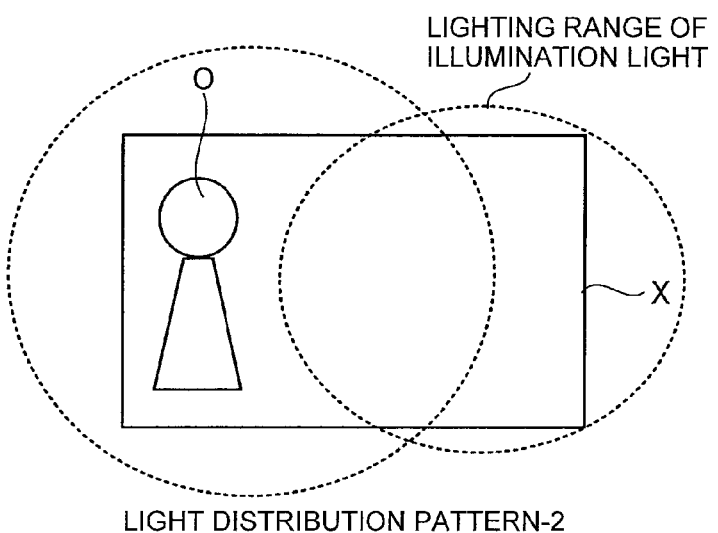
Figure 4C:
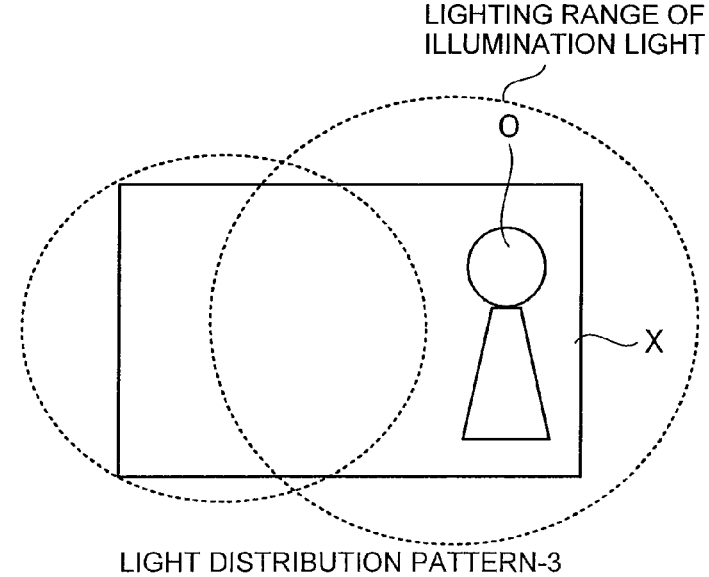

The operation of the flash light device 1 having the above-described configuration is described below. According to the flash light device 1 of the embodiment of the invention, three typical light-distribution patterns can be achieved as shown in the example described below. FIG. 3A is a chart showing the modes of drive current control for each light-emitting portion that corresponds to each of the above-noted three light-distribution patterns, and shows the relative relationship of the amount of electric current applied to first and second light-emitting portions 301, 302. In FIG. 3A, the circle indicates that the applied electric current amount is comparatively high, and the triangle indicates that the applied electric current amount is relatively low. FIGS. 3B to 3D are graphs schematically showing light emission intensity distributions on the light extraction plane of the LED chip 220 that correspond to each of three light-distribution patterns, respectively, and show the light emission intensity distribution on a line that connects the pad portion 224a and the pad portion 224b. FIGS. 4A to 4C are diagrams schematically showing the lighting ranges of the illumination light that correspond to each of the three light-distribution patterns.

The first light-distribution pattern (or light-distribution pattern-1) is used for forming a light-distribution that does not have bias in the left and right brightness inside the image pickup area (or angle of view). The controller 40 receives a control signal indicating that an object O is positioned in the center of an image pickup area X, as shown in FIG. 4A, from a CPU (not shown) or the like for operating and controlling the entire image pickup device, and thereupon generates and feeds an electric current command value, which sets the first and second light-emitting portions 301, 302 to the same light emission intensity as each other, to the drive circuit 30. The drive circuit 30 controls the drive current so that the electric current amounts applied to the first and second light-emitting portions 301, 302 are equal to each other on the basis of the electric current command value. In accordance therewith, the first and second light-emitting portions 301, 302 on the LED chip 220 emit light with the same light emission intensity as each other. As a result, a light emission intensity distribution in which a peak appears at the two end portions is formed in the light extraction plane of the LED chip 220, as shown in FIG. 3B. The light emitted from the LED chip 220 is directed via the lens 250 onto the object O so as to cover the entire image pickup area X, as shown in FIG. 4A. The illumination light is directed onto the object O positioned in the center of the image pickup area X with an unbiased light-distribution in the image pickup area X.

The second light-distribution pattern (or light-distribution pattern-2) forms a light distribution in which the left side in the image pickup area is brighter. The controller 40 receives a control signal indicating that an object O is positioned at the left end of the image pickup area X, as shown in FIG. 4B, and thereupon generates and feeds to the drive circuit 30 an electric current command value for setting the light emission intensity in the first light-emitting portion 301 to be relatively greater. The drive circuit 30 controls the drive current so that the electric current amount applied to the first light-emitting portion 301 is greater than the electric current amount applied to the second light-emitting portion 302 on the basis of the electric current command value. In accordance therewith, the first light-emitting portion 301 on the LED chip 220 emits light having a greater light emission intensity than that of the second light-emitting portion 302. As a result, a light emission intensity distribution in which a peak appears on the left side is formed in the light extraction plane of the LED chip 220, as shown in FIG. 3C. The light emitted from the LED chip 220 is directed via the lens 250 onto the object O so as to cover the entire image pickup area X, as shown in FIG. 4B. The illumination light is directed onto the object O positioned at the left end of the image pickup area X with a light distribution in which the left side is brighter in the image pickup area X.

The third light-distribution pattern (or light-distribution pattern-3) forms a light distribution in which the right side of the image pickup area is brighter. The controller 40 receives a control signal indicating that an object O is positioned at the right end of the image pickup area X, as shown in FIG. 4C, and thereupon generates and feeds to the drive circuit 30 an electric current command value for setting the light emission intensity in the second light-emitting portion 302 to be relatively greater. The drive circuit 30 controls the drive current so that the electric current amount applied to the second light-emitting portion 302 is greater than the electric current amount applied to the first light-emitting portion 301 on the basis of the electric current command value. In accordance therewith, the second light-emitting portion 302 on the LED chip 220 emits light with a light emission intensity that is greater than that of the first light-emitting portion 301. As a result, a light emission intensity distribution in which a peak appears on the right side is formed in the light extraction plane of the LED chip 220, as shown in FIG. 3D. The light emitted from the LED chip 220 is directed via the lens 250 onto the object O so as to cover the entire image pickup area X, as shown in FIG. 4C. The illumination light is directed onto the object O positioned at the right end of the image pickup area X with a light distribution in which the right side is brighter in the image pickup area X.

In this manner, the LED chip 220 according to the first embodiment of the invention has first and second electrode pieces 223a, 223b separated at a distance from each other on the chip surface, and has, as a result, two first and second light-emitting portions 301, 302 divided at a distance from each other. The first and second electrode pieces 223a, 223b have pad portions 224a, 224b, respectively, disposed at the peripheral portion of the LED chip, and extension portions 225a, 225b, respectively, that are connected to the pad portions 224a, 224b and that extend in a direction away from the pad portions 224a, 224b (i.e., toward the center portion of the chip). The terminal end portions of the extension portions 225a, 225b face each other across a gap in the center portion of the LED chip. The extension portions 225a, 225b have a resistance component that increases along the extension direction thereof, and therefore have an electric current density at the terminal end portions that decreases in a relative manner. Therefore, a portion in which the electric current density is relatively lower, i.e., a portion in which the light emission intensity is relatively lower, is formed in the center portion of the LED chip. The two first and second light-emitting portions 301, 302 formed on the LED chip are arranged so that the portion in which the light emission intensity is relatively lower is disposed therebetween. In this manner, the light emitted simultaneously from the two first and second light-emitting portions 301, 302 can be perceived as two light emission points. In other words, the two light-emitting portions are regarded as two independent light sources, and it is therefore possible to readily form a desired light distribution, as shown in FIGS. 4A to 4C.

Second Embodiment

Figure 5:
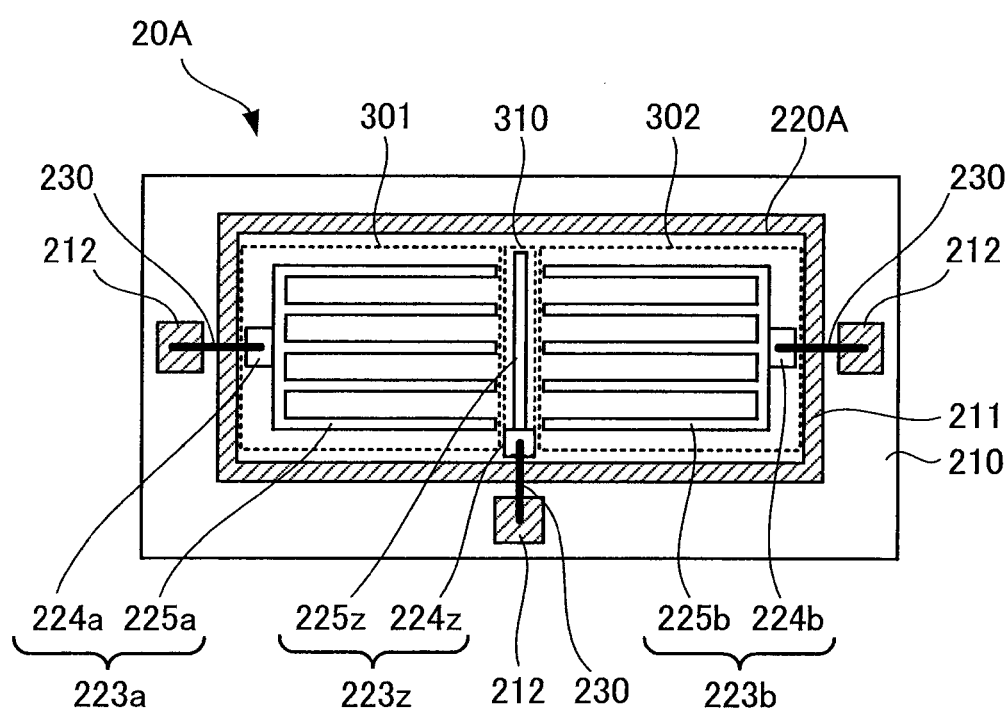
FIG. 5 is a plan view showing the configuration of the light source portion according to a second embodiment of the invention.

FIG. 5 is a plan view showing the configuration of a light source portion 20A provided to the flash light device according to a second embodiment of the invention. The configuration of the cathode electrode of the LED chip 220A constituting the light source portion 20A is modified in comparison with the LED chip 220 according to the first embodiment described above. A cathode electrode 223A of the LED chip 220A has a first electrode piece 223a, a second electrode piece 223b, and an auxiliary electrode piece 223z. The configuration of the first and second electrode pieces 223a, 223b is the same as those of the LED chip 220 according to the first embodiment described above. The auxiliary electrode piece 223z is composed of: an extension portion 225z that extends inside a gap formed between terminal end portions of an extension portion 225a of the first electrode piece and an extension portion 225b of the second electrode piece; and a pad portion 224z connected to the extension portion 225z and arranged on the peripheral portion of the chip. The pad portion 224z is connected to bonding pads 212 on a substrate 210 via bonding wires 230 and is connected to the drive circuit 30. Thus, the auxiliary electrode piece 223z set at a distance from the first and second electrode pieces 223a, 223b is disposed on the LED chip, whereby an auxiliary light-emitting portion 310 that can be independently controlled between a first light-emitting portion 301 and a second light-emitting portion 302 is formed on the LED chip. The other constituent portions other than the light source portion 20A are the same as those of the flash light device of the first embodiment described above.

Figure 7:
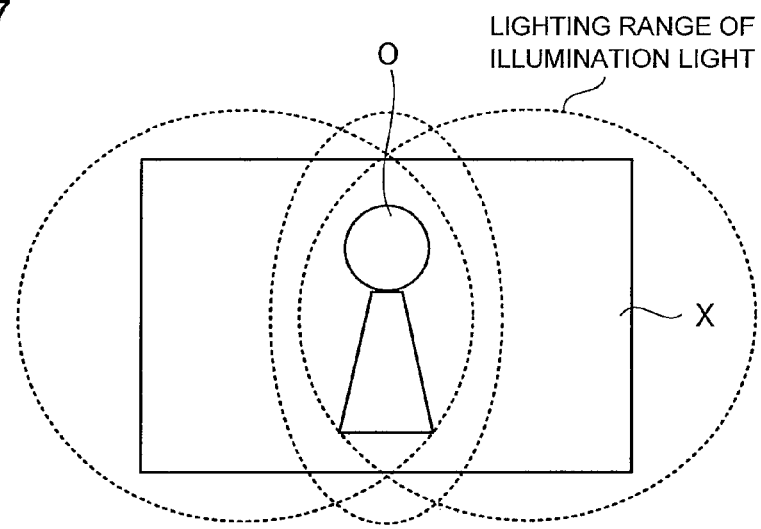
FIG. 7 is a diagram showing the lighting range of the illumination light that corresponds to the light-distribution pattern.

In accordance with the flash light device provided with the LED chip 220A according to the second embodiment, four typical light-distribution patterns as described below can be achieved. FIG. 6A is a chart showing modes of drive current control for each of the light-emitting portions that corresponds to each of the four light-distribution patterns mentioned above, and shows the relative relationship between the electric current amounts applied to the first and second light-emitting portions 301, 302 and the auxiliary light-emitting portion 310. In FIG. 6A, the circle indicates that the applied electric current amount is comparatively high, and the triangle indicates that the applied electric current amount is comparatively low. FIGS. 6B to 6E are graphs showing light emission intensity distributions on the light extraction plane of the LED chip 220A that correspond to each of the four light-distribution patterns. FIG. 7 is a diagram showing the lighting ranges of the illumination light that corresponds to the four later-described light-distribution patterns.

The first to third light-distribution patterns are the same as those of the flash light device according to the first embodiment described above. In other words, the first light-distribution pattern forms a light distribution unbiased in left and right brightness in the image pickup area (see FIG. 6B). In the case that such a light distribution is formed, the amount of electric current applied to the first light-emitting portion 301 and the second light-emitting portion 302 is the same, and the amount of electric current applied to the auxiliary light-emitting portion 310 is relatively low. The second light-distribution pattern forms a light distribution in which the left side in the image pickup area becomes brighter (see FIG. 6C). In the case that such a light distribution is formed, the amount of electric current applied to the first light-emitting portion 301 is relatively increased and the amount of electric current applied to the second light-emitting portion 302 and the auxiliary light-emitting portion 310 is relatively reduced. The third light-distribution pattern forms a light distribution in which the right side in the image pickup area becomes brighter (see FIG. 6D). In the case that such a light distribution is formed, the amount of electric current applied to the second light-emitting portion 302 is relatively increased and the amount of electric current applied to the first light-emitting portion 301 and the auxiliary light-emitting portion 310 is relatively reduced.

The fourth light-distribution pattern (or light-distribution pattern-4) forms a light distribution having a light emission intensity peak in the center and in the left and right sides in the image pickup area (see FIG. 6E). In the case that such a light distribution is formed, the amounts of electric current applied to the first light-emitting portion 301, the second light-emitting portion 302, and the auxiliary light-emitting portion 310 are the same. In accordance with the fourth light-distribution pattern, it is possible to illuminate an object O positioned in the center of the image pickup area, as shown in, e.g., FIG. 7, using illumination light having higher light emission intensity.

In accordance with the configuration of the cathode electrode of the LED chip 220 according the first embodiment described above, a low electric current density region is formed in the center portion of the chip, and therefore a portion in which the light emission intensity is relatively low is formed in the center portion of the chip in the case that the first and second light-emitting portions 301, 302 are made to emit light simultaneously. Accordingly, it is difficult to form a light distribution in which the center portion of the image pickup area is made relatively brighter. On the other hand, the cathode electrode of the LED chip 220A according to the second embodiment furthermore has an auxiliary electrode piece 223c having the extension portion 225z that extends into the low electric current density region in the first embodiment (i.e., the gap between the first electrode piece 223a and the second electrode piece 223b). In accordance with this electrode configuration, it is possible to also apply a drive current to the center portion of the LED chip, and to form a light distribution in which the center portion of the image pickup area becomes relatively brighter.

Third Embodiment

Figure 8:
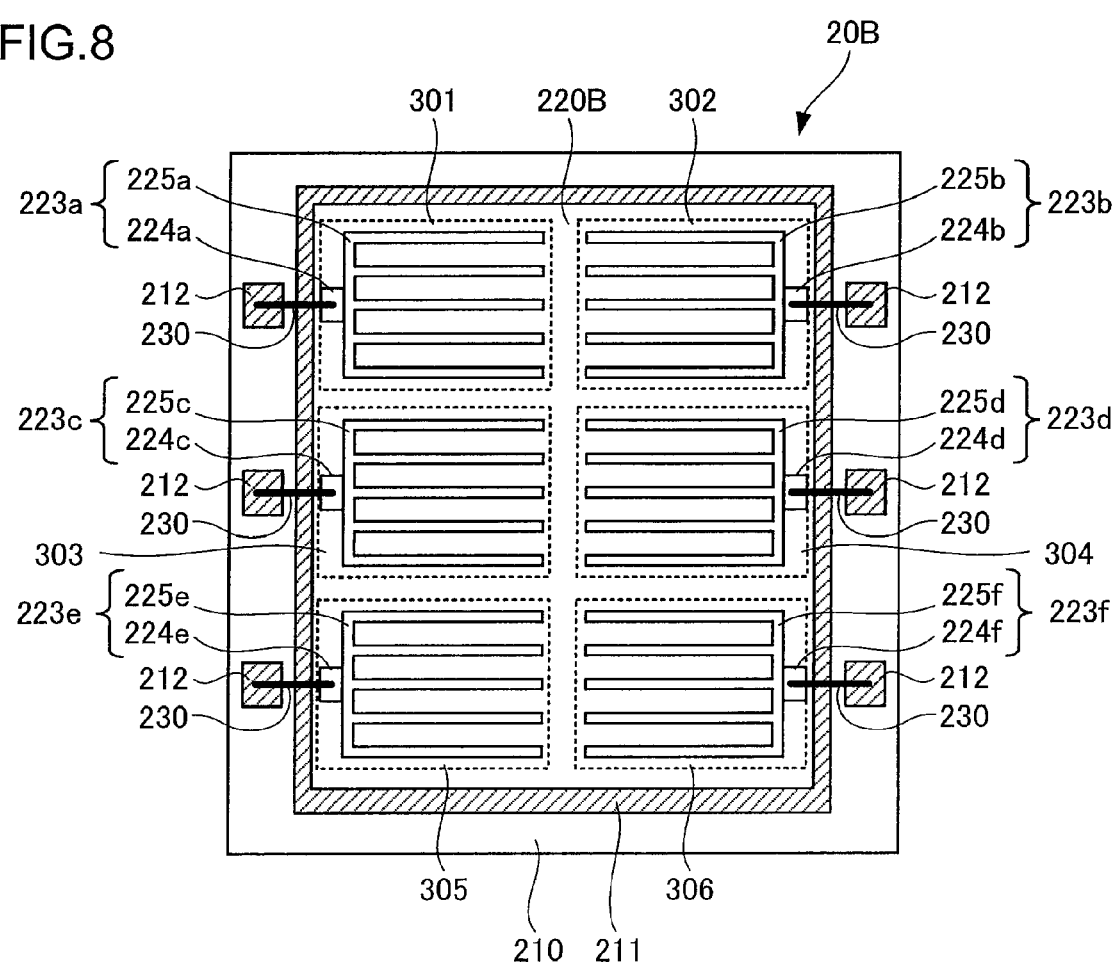
FIG. 8 is a plan view showing the configuration of the light source portion according to a third embodiment of the invention.

FIG. 8 is a plan view showing the configuration of the light source portion 20B provided to the flash light device according to a third embodiment of the invention. An LED chip 220B constituting a light source portion 20B has a cathode electrode composed of first to sixth electrode pieces 223a to 223f that are set at a distance from each other. The six electrode pieces 223a to 223f are composed of extension portions 225a to 225f having a comb pattern or shape, and pad portions 224a to 224f, respectively, in similar fashion to the first electrode piece 223a and the second electrode piece 223b according to the first embodiment described above. The six electrode pieces 223a to 223f are disposed in an array so that a pair composed of the first electrode piece 223a and the second electrode piece 223b in the first embodiment line up in the vertical direction in the drawing. The cathode electrode composed of the first to sixth electrode pieces 223a to 223f forms a point symmetric pattern about the center point of the light extraction plane of the LED chip.

The mutually adjacent electrode pieces 223a to 223b, 223c to 223d, 223e to 223f are arranged so that the terminal end portions of the extension portions are opposed to each other across a gap in the center portion of the chip. The terminal end portions of the extension portions 225a to 225f are concentrated in the center portion of the chip surface, and a low electric current density region is therefore formed in the center portion of the LED chip.

The pad portions 224a to 224f are connected to the drive circuit 30 via bonding wires 230. Thus, the six electrode pieces 223a to 223f are set at a distance from each other on the LED chip 220B, whereby first to sixth light-emitting portions 301 to 306 capable of being independently controlled are formed on the LED chip 220B. When drive current is applied to the light-emitting portions, the light emission intensity in the peripheral portion of the chip where the pad portions 224a to 224f are disposed increases in a relative manner, and a light emission intensity distribution is formed in which the light emission intensity gradually decreases in progression toward the center portion of the chip. The other constituent portions other than the light source portion 20B are the same as those of the flash light device of the first embodiment described above.

When the focal distance of the lens system in the image pickup device is varied, the range (or size) of the image pickup area (or angle of view) is also varied. In accordance with the flash light device provided with the LED chip 220B according to the present embodiment, it is possible to advantageously control light distribution such as varying the lighting range of the illumination light in accordance with the variation of the range (size) of the image pickup area.

FIG. 9A is an example of modes of electric current control for each light-emitting portion in accordance with the range (size) of the image pickup area, and FIGS. 9B and 9C are diagrams showing lighting range of the illumination light that corresponds to the electric current control shown in FIG. 9A.

When the controller 40 receives information related to the range of the image pickup area from the CPU or the like for controlling the operation of the image pickup device overall, the controller generates and feeds to the drive circuit 30 an electric current command value that corresponds to the range (size) of the image pickup area. The drive circuit 30 controls the amount of electric current applied to the first to sixth light-emitting portions 301 to 306 on the basis of the electric current command value.

For example, in the case that the range of the image pickup area (or angle of view) has become comparatively great because the lens system of the image pickup device has moved to the wide angle side and the focal distance has become comparatively short, the amount of electric current applied to the first to sixth light-emitting portions 301 to 306 is controlled so as to be comparatively high, as shown in the upper part of FIG. 9A. The first to sixth light-emitting portions 301 to 306 emit light having a comparatively high light emission intensity, and illumination light is directed onto the entire image pickup area X having a comparatively large size, as shown in FIG. 9B.

On the other hand, in the case that the range of the image pickup area (angle of view) has become comparatively small because the lens system of the image pickup device has moved to the telescopic side and the focal distance has become comparatively great, the amount of electric current applied to the first and second light-emitting portions 301, 302 and to the fifth and sixth light-emitting portions 305, 306 is controlled to become comparatively low, and the amount of electric current applied to the third and fourth light-emitting portions 303, 304 is controlled to become comparatively high, as shown in the lower part of FIG. 9A. Although the lighting range of the illumination light in the upper and lower parts of the image pickup area X is thereby reduced in comparison with the case of FIG. 9B, the illumination light is directed onto the entire image pickup area X, which has been reduced in accordance with the focal distance, as shown in FIG. 9C. Thus, in accordance with the flash light device provided with the LED chip 220B according to the third embodiment, it is possible to advantageously control light distribution, such as modifying the lighting range in accordance with the range (size) of the image pickup area (angle of view), which is modified in accordance with the focal distance of the image pickup device.

In a mode in which the range of the image pickup area is reduced, it is assumed that the object is positioned far away. In this case, the light emission time in the light source portion 20B must be extended in order to ensure luminous exposure. In the case that a flash of light is to be generated using a capacitor, there is a problem in ensuring light emission time because the amount of charge that can be accumulated in the capacitor is limited. As described above, the lighting range of the illumination light is reduced in accompaniment with the reduction in the range of the image pickup area, whereby the light emission time in the light source portion 20B can be extended further. Light distribution control such as modifying the lighting range in accordance with the range of the image pickup area can be achieved in the LED chip according to the first and second embodiments described above.

In accordance with the flash light device provided with the LED chip 220B according to the third embodiment, the light source portion 20B can generate advantageous illumination light not only in the flash light-emitting mode for emitting a photoflash (i.e., flash of light) having a comparatively high light emission intensity, but also in the continuous light-emitting mode for emitting continuous light having a comparatively low light emission intensity. FIG. 10 is a chart showing the modes of electric current control for each of the light-emitting portions in the flash light-emitting mode and the continuous light-emitting mode, and shows the relative relationship of the amount of electric current applied to light-emitting portions. In FIG. 10, the circle indicates that the applied electric current amount is comparatively high, the triangle indicates that the applied electric current amount is comparatively low, the X mark indicates that the applied amount of electric current is 0 (zero).

In the case that the controller 40 receives a control signal from the exterior indicating that the flash light-emitting mode has been selected, the controller generates and feeds to the drive circuit 30 an electric current command value that corresponds to the flash light-emitting mode. The drive circuit 30 performs electric current control so that the amount of electric current applied to the first to sixth light-emitting portions 301 to 306 becomes comparatively greater (e.g., about 1 A (ampere)) during a short interval of, e.g., several tens of milliseconds, on the basis of the electric current command value. The first to sixth light-emitting portions 301 to 306 emit a photoflash having a comparatively high light emission intensity in the above-noted interval.

On the other hand, in the case that the controller 40 receives a control signal from the exterior indicating that the continuous light-emitting mode has been selected, the controller generates and feeds to the drive circuit 30 an electric current command value that corresponds to the continuous light-emitting mode. The drive circuit 30 performs electric current control so that, on the basis of the electric current command value, the amount of electric current applied to the third and fourth light-emitting portions 303, 304 becomes comparatively less (e.g., about 10 mA), and the amount of electric current applied to the remainder of the light-emitting portions becomes 0. The third and fourth light-emitting portions 303, 304 will continuously emit light at a comparatively low light emission intensity.

In the flash light device in which the LED chip is used, operation is required in not only the flash light-emitting mode, but also in a continuous light-emitting mode such as a torchlight light-emitting mode or a video light light-emitting mode. The continuous light-emitting mode is intended for illumination light during close-up photography or the like, and the light emission intensity must be sufficiently suppressed in comparison with the flash light-emitting mode. A conventional LED chip applied to a flash light device is of a high-brightness type that can be applied to general illumination and automotive headlights, and presumes the use of a high-electric-current drive. For this reason, it is difficult to stably obtain light emission in which the electric current density inside the LED chip is dramatically reduced when the amount of applied electric current is reduced in order to sufficiently suppress light emission intensity.

In the flash light device according to the present embodiment, only some of the light-emitting portions in the LED chip are made to emit light in the continuous light-emitting mode, and it is therefore possible to prevent a dramatic reduction in the electric current density even when the amount of applied electric current is reduced. Operational stability in the continuous light-emitting mode can be improved thereby. Some of the light radiated from some of the lighted light-emitting portions is absorbed by the non-lighted light-emitting portions, or is directed away in a direction other than the direction in which the light is directed. Therefore, it is possible to ensure that the light emission intensity is even further suppressed. In this manner, it is possible to obtain an advantageous illumination light for the flash light-emitting mode as well as the continuous light-emitting mode, in accordance with the flash light device according to the present embodiment.

Fourth Embodiment

Figure 11A:
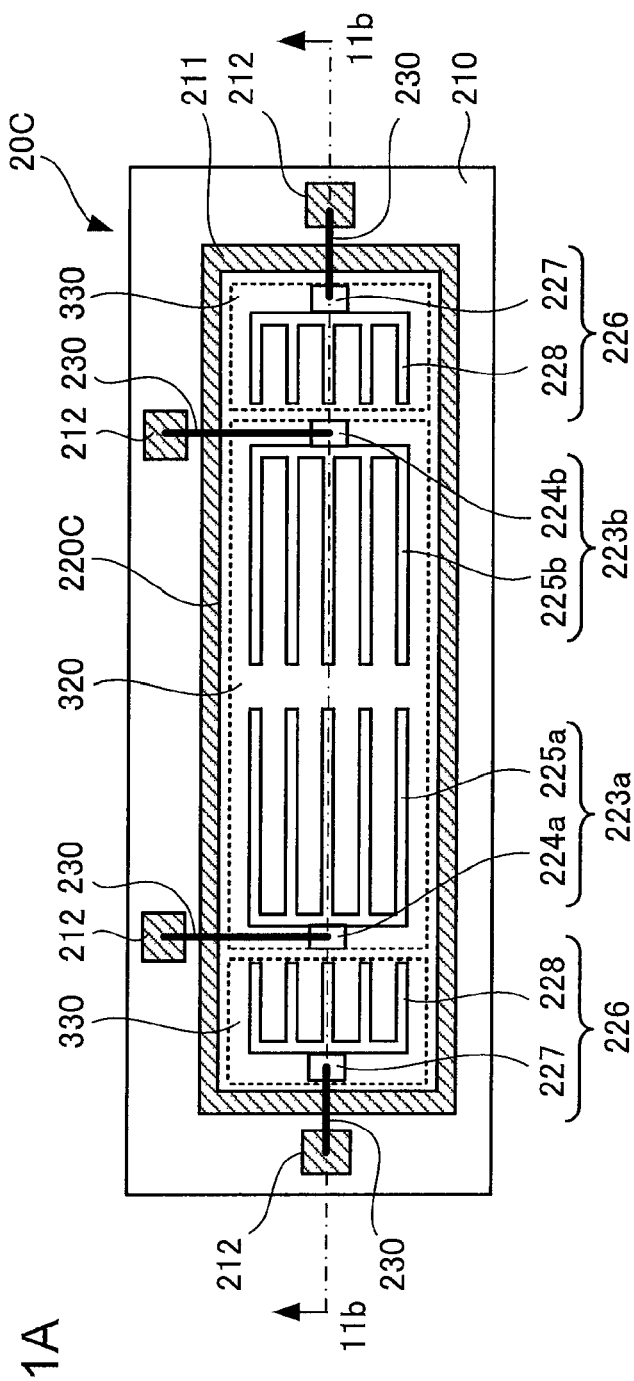
FIG. 11A is a plan view showing the configuration of the light source portion 2 according to the fourth embodiment of the invention.
Figure 11B:
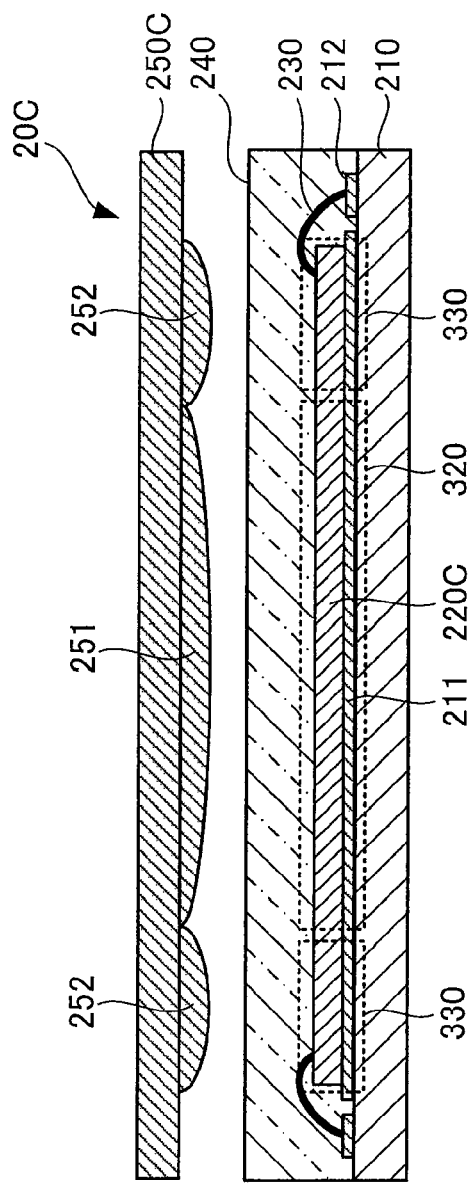
FIG. 11B is a cross-sectional view along the line 11a-11b in FIG. 11A.

FIG. 11A is a plan view showing the configuration of the light source portion 20C provided to the flash light device according to the fourth embodiment of the invention, and FIG. 11B is a cross-sectional view along the line 11a-11b in FIG. 11A. The LED chip 220C constituting the light source portion 20C has a flash light-emitting portion 320 for performing flash light emission during photography, and a preliminary light-emitting portion 330 for preliminarily emitting light before flash light emission. Preliminary light emission is a function for emitting light a single time or a plurality of times prior to photography in order to adjust exposure and the like in an image pickup device.

The flash light-emitting portion 320 has first and second electrode pieces 223a, 223b, which have the same configuration as those of the LED chip 220 according to the first embodiment. In other words, the flash light-emitting portion 320 has two independently controllable light-emitting portions, and light distributions such as those shown in FIGS. 4A to 4C can be formed.

A preliminary light emitting portion 330 is arranged at both end portions of the LED chip 220C so that the flash light-emitting portion 320 is disposed therebetween. The preliminary light emitting portion 330 has an electrode piece 226 composed of: a pad portion 227 disposed at the periphery portion of the LED chip 220C; and an extension portion 228 connected to the pad portion 227 and having a comb pattern extending into the preliminary light emitting portion 330. The pad portion 227 is connected to the bonding pads 212 on the substrate 210 via the bonding wires 230, and is connected to the drive circuit 30. The preliminary light emitting portion 330 can be controlled independent from the flash light-emitting portion 320. The electrode piece 226 may be configured so that the light emission intensity in the preliminary light emitting portion 330 is substantially uniform.

The LED chip 220C is bonded onto the die pad 211 on the substrate 210 via an electroconductive die attachment material (not shown). The pad portions 224a, 224b, 227 disposed on the LED chip are connected to the bonding pads 212 on the substrate 210 via the bonding wires 230, and are connected to the drive circuit 30. The fluorescent-substance containing resin 240 is disposed on the substrate 210 so as to embed the LED chip 220C. A lens 250C is disposed above (i.e., forward in the light projection direction) the fluorescent-substance containing resin 240.

The lens 250C has a lens surface 251 that projects light emitted from the flash light-emitting portion 320 so as to cover the entire image pickup area, and a lens surface 252 that projects light emitted from each of the preliminary light emitting portions 330 so as to cover the entire image pickup area. In other words, the lens 250C has a focal point that corresponds to the flash light-emitting portion 320, and a focal point that corresponds to each preliminary light emitting portion 330.

FIG. 12A is a chart showing modes of electric current control for each light-emitting portion in the preliminary light-emitting mode and the flash light-emitting mode. In FIG. 12A, the circle indicates that the input of the drive current is applied to the light-emitting portion, and an X mark indicates that the input of the drive current is not applied to light-emitting portion.

When the controller 40 detects a shutter operation or other input control, the controller generates and feeds to the drive circuit 30 an electric current command value that corresponds to the preliminary light-emitting mode. The drive circuit 30 performs electric current control so that drive current is applied only to the preliminary light emitting portion 330, on the basis of the electric current command value. The preliminary light emitting portion 330 generates a single photoflash or several photoflashes in accordance with the electric current control. The light source portion 20C directs a photoflash having the same light emission intensity as during the flash light-emitting mode toward the image pickup area so as to cover the entire image pickup area. The image pickup device adjusts the exposure and carries out other operations during preliminary light emission.

After the preliminary light-emitting mode has ended, the controller 40 generates and feeds to the drive circuit 30 an electric current command value that corresponds to the flash light-emitting mode. The drive circuit 30 performs electric current control so that drive current is applied only to the flash light-emitting portion 320, on the basis of the electric current command value. The flash light-emitting portion 320 generates a photoflash in accordance with the electric current control. The light source portion 20C directs a photoflash toward the image pickup area so as to cover the entire image pickup area. The image pickup device photographs the object while the flash light emission is being carried out.

FIGS. 12B and 12C are diagrams showing the lighting range of the illumination light (photoflash) directed from the light source portion 20C toward the image pickup area X during preliminary light emission and flash light emission, respectively. The lens 250C has a focal point that corresponds to the flash light-emitting portion 320 and each preliminary light emitting portion 330, as described above, and performs alignment so that the lighting range of the photoflash emitted from the flash light-emitting portion 320 and the lighting range of the photoflash emitted from the preliminary light emitting portion 330 match.

The interval between the end of preliminary light emission and the start of flash light emission is generally about several tens of milliseconds. Accordingly, in the case that the area in which preliminary light emission is carried out and the area in which the flash light emission is carried out in the LED chip are the same, there may be cases in which the maximum luminous energy cannot be obtained during flash light emission due to the effect of heat generated during preliminary light emission. The flash light device according to the present embodiment has the preliminary light-emitting portion and the flash portion on a single LED chip, and only the preliminary light-emitting portion is driven during the preliminary light-emitting mode. Accordingly, the heat generated during preliminary light emission has substantially no effect during flash light emission, and a flash light emission having maximum luminous energy can be obtained.

This application is based on Japanese Patent Application No. P2011-123270 which is hereby incorporated by reference.

What is claimed is:

1. A flash light device provided with a semiconductor light-emitting element, the semiconductor light-emitting element comprising a first semiconductor layer having a first electrical conductivity, a second semiconductor layer having a second electrical conductivity that is different from said first electrical conductivity, an active layer disposed between said first semiconductor layer and said second semiconductor layer, and a first electrode and a second electrode respectively disposed on surfaces of the first and second semiconductor layers, wherein:
    said first electrode comprises a plurality of electrode pieces separated at a distance from each other;
    each of said plurality of electrode pieces comprises a power feed pad and an extended portion that is connected to said power feed pad and that extends in a direction away from said power feed pad, wherein a terminal end portion of said extended portion of one of said plurality of electrode pieces is opposed to a terminal end portion of said extended portion of another of said plurality of electrode pieces across a gap;
    the flash light device comprises a controller for feeding drive current to said semiconductor light-emitting element via each of said plurality of electrode pieces; and
    said controller switches between a flash light-emitting mode for feeding drive current to each of said plurality of electrode pieces so that said semiconductor light-emitting element emits a photoflash, and a continuous light-emitting mode for feeding drive current that is less than the drive current in said flash light-emitting mode to some of said plurality of electrode pieces so that said semiconductor light-emitting element emits continuous light.

2. The flash light device according to claim 1, wherein said plurality of electrode pieces form a point symmetric pattern on the surface of the first semiconductor layer.

3. The flash light device according to claim 1, wherein each of said power feed pads is arranged in a peripheral portion of said first semiconductor layer, and each of said extended portions extends from the peripheral portion toward a center portion of said first semiconductor layer.

4. The flash light device according to claim 1, wherein said extended portions form a comb pattern.

5. The flash light device according to claim 1, wherein said first electrode includes an auxiliary electrode piece that extends within said gap.

6. The flash light device according to claim 1, wherein said controller carries out a first step for feeding drive current to any of said plurality of electrode pieces so that said semiconductor light-emitting element emits a photoflash, and thereafter carries out a second step for feeding drive current to electrode pieces that are different from the electrode pieces to which drive current was fed in said first step so that said semiconductor light-emitting element emits a photoflash.

7. The flash light device according to claim 6, further comprising a lens for projecting the photoflash emitted in said first step and the photoflash emitted in said second step mutually in a same lighting range.

8. The flash light device according to claim 1, further comprising a lens having a single focus for said plurality of electrode pieces, the lens being provided above said semiconductor light-emitting element.

9. A flash light device provided with a semiconductor light-emitting element, the semiconductor light-emitting element comprising a first semiconductor layer having a first electrical conductivity, a second semiconductor layer having a second electrical conductivity that is different from said first electrical conductivity, an active layer disposed between said first semiconductor layer and said second semiconductor layer, and a first electrode and a second electrode respectively disposed on surfaces of the first and second semiconductor layers, wherein:
    said first electrode comprises a plurality of electrode pieces separated at a distance from each other;
    each of said plurality of electrode pieces comprises a power feed pad and an extended portion that is connected to said power feed pad and that extends in a direction away from said power feed pad, wherein a terminal end portion of said extended portion of one of said plurality of electrode pieces is opposed to a terminal end portion of said extended portion of another of said plurality of electrode pieces across a gap;
    the flash light device comprises a controller for feeding drive current to said semiconductor light-emitting element via each of said plurality of electrode pieces; and
    said controller carries out a first step for feeding drive current to any of said plurality of electrode pieces so that said semiconductor light-emitting element emits a photoflash, and thereafter carries out a second step for feeding drive current to electrode pieces that are different from the electrode pieces to which drive current was fed in said first step so that said semiconductor light-emitting element emits a photoflash.

10. The flash light device according to claim 9, wherein said plurality of electrode pieces form a point symmetric pattern on the surface of the first semiconductor layer.

11. The flash light device according to claim 9, wherein each of said power feed pads is arranged in a peripheral portion of said first semiconductor layer, and each of said extended portions extends from the peripheral portion toward a center portion of said first semiconductor layer.

12. The flash light device according to claim 9, wherein said extended portions form a comb pattern.

13. The flash light device according to claim 9, wherein said first electrode includes an auxiliary electrode piece that extends within said gap.

14. The flash light device according to claim 9, further comprising a lens for projecting the photoflash emitted in said first step and the photoflash emitted in said second step mutually in a same lighting range.

15. The flash light device according to claim 9, further comprising a lens having a single focus for said plurality of electrode pieces, the lens being provided above said semiconductor light-emitting element.

\* \* \* \* \*